US007924081B2

(12) United States Patent
Lorenzo et al.

(10) Patent No.: US 7,924,081 B2
(45) Date of Patent: Apr. 12, 2011

(54) SELF-ADAPTIVE SOFT TURN-ON OF POWER SWITCHING DEVICES

(75) Inventors: Costanzo Lorenzo, Catania (IT); Patti Davide Giuseppe, Catania (IT); Tagliavia Donato, Acireale (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 564 days.

(21) Appl. No.: 12/012,213

(22) Filed: Jan. 30, 2008

(65) Prior Publication Data

US 2008/0197717 A1 Aug. 21, 2008

(30) Foreign Application Priority Data

Jan. 30, 2007 (IT) .............................. MI2007A0139

(51) Int. Cl.

| | |
|---|---|
| ***H03K 17/06*** | (2006.01) |
| ***H03K 17/14*** | (2006.01) |
| ***F02P 3/08*** | (2006.01) |

(52) U.S. Cl. ......... 327/376; 327/378; 123/618; 361/253

(58) Field of Classification Search .................. 327/376, 327/378; 361/253; 123/618

See application file for complete search history.

(56) References Cited

U.S. PATENT DOCUMENTS 4,964,377 A * 10/1990 Scarnera ........................ 123/605
5,127,388 A * 7/1992 Cicalese et al. ............... 123/644

* cited by examiner

*Primary Examiner* — Evan Pert

(74) *Attorney, Agent, or Firm* — Lisa K. Jorgenson; Kevin D. Jablonski; Graybeal Jackson LLP

(57) ABSTRACT

An embodiment of a control circuit is proposed for turning on a power switching device, the switching device turning on in response to a control signal exceeding a threshold value. The control circuit includes pre-charging means for providing the control signal at a pre-charging value not reaching the threshold value, and soft turn-on means for gradually increasing the control signal from the pre-charging value to a turn-on value exceeding the threshold value; the pre-charging means includes means for sensing an indication of the threshold value, and means for setting the pre-charging value according to the sensed threshold value.

36 Claims, 4 Drawing Sheets

SELF-ADAPTIVE SOFT TURN-ON OF POWER SWITCHING DEVICES

PRIORITY CLAIM

This application claims priority from Italian patent application No. MI2007A000139, filed Jan. 30, 2007, which is incorporated herein by reference.

TECHNICAL FIELD

An embodiment of the present invention relates to the electronics field. More specifically, an embodiment of the present invention relates to the turn-on of power switching devices.

BACKGROUND

Power switching devices are routinely used in a number of applications; commonly, a power switching device is implemented by means of a transistor—for example, an Insulated Gate Bipolar Transistor (IGBT)—capable of sustaining high voltages (such as up to 100-1,000V) and of driving large currents (such as up to 0.1-10 A). A typical example of an application of the IGBT is in the automotive field, wherein the IGBT can be used to control the ignition sparks of plugs in an internal-combustion engine.

Particularly, in such application the IGBT is coupled with a primary winding of a transformer; the transformer has a plurality of secondary windings, each one coupled with a respective spark plug. The IGBT is firstly turned on by applying a suitable voltage to its gate terminal. As a result, the IGBT passes from an off (blocking) state—wherein a collector-emitter voltage thereof is about equal to a voltage provided by an automotive battery (typically 12V, with respect to a reference or ground voltage)—to an on state—wherein the same collector-emitter voltage reaches a saturation voltage (such as lower than 1V). In this way, a voltage across the primary winding passes from the ground voltage (i.e., 0V) to approximately the battery voltage (i.e., 12V). This causes the charging of the primary winding with a current having a linear-like pattern. The peak value of this charging current is determined by the length of a time interval, during which the IGBT is kept on. At this point, when the shooting of an ignition spark is required the IGBT is turned off so as to cause an abrupt cut of the charging current. Consequently, an extra-voltage appears across the primary winding; this generates a very high voltage at each secondary winding (of the order of some thousands of volts), which high voltage causes the generation of the ignition spark.

When the IGBT turns on in order to charge the primary winding, the voltage across the primary winding undergoes a sharp variation, having a duration corresponding to a turn-on transient period of the IGBT (while switching from the off state to the on state). Typically, by applying a step voltage to the gate terminal of the IGBT, the duration of the turn-on transient period is of the order of hundreds of nanoseconds. However, this results in a very high incremental ratio $\Delta V/\Delta t$ of the voltage across the primary winding, which generates an overshoot that may cause an undesired ignition spark.

In order to solve this problem, the IGBT is generally controlled to obtain a so-called soft turn-on thereof, wherein the collector-emitter voltage of the IGBT is gradually decreased (from 12V to 1V). For this purpose, it is possible to apply a direct turn-on current to the gate terminal of the IGBT; the turn-on current charges corresponding stray capacitors, so as to increase the gate voltage relatively slowly until the IGBT turns on. In this way, the incremental ratio $\Delta V/\Delta t$ of the voltage across the primary winding of the transformer is greatly reduced (thereby avoiding any undesired ignition sparks).

Unfortunately, the above described soft turn-on procedure may increase a turn-on delay between the application of the signal required to turn-on the IGBT and its actual switching. The turn-on delay may cause a corresponding reduction of the maximum charging current that is reached when the IBGT is turned off to generate the ignition spark, and consequently a reduction of the energy stored in the transformer (for the same time available); this may cause a poor ignition spark when the turn-on delay is too long.

A solution known in the art for reducing the length of the turn-on delay (without causing any overshoots) consists of pre-charging the gate terminal of the IGBT—to a pre-charging voltage lower than its threshold voltage—before the application of the above-described turn-on current. However, the threshold voltage of the IGBT is strictly related to manufacturing process spreads and to temperature variations. Therefore, the pre-charging voltage takes a worst-case value sufficiently low to ensure that the IGBT is kept off (before applying the turn-on current) in any condition. Accordingly, such solution may not be completely satisfactory, since in most practical situations the length of the turn-on delay remains significantly high.

In any case, the length of the turn-on delay varies according to the actual operative conditions. Therefore, it may be impossible to control the generation of the ignition sparks accurately.

SUMMARY

In its general terms, an embodiment the present invention is based on the idea of self-adapting to the power switching devices.

More specifically, an embodiment of the present invention proposes a control circuit for turning on a power switching device; the switching device turns on in response to a control signal exceeding a threshold value. The control circuit includes pre-charging means for providing the control signal at a pre-charging value, which does not reach the threshold value. Soft turn-on means is used for gradually increasing the control signal from the pre-charging value to a turn-on value (exceeding the threshold value). The pre-charging means includes means for sensing an indication of the threshold value; further means is used for setting the pre-charging value according to the sensed threshold value.

The pre-charging value may be set to the sensed threshold value reduced by a predetermined amount.

For this purpose, a buffer with a gain lower than 1 may be used.

The threshold value may be sensed by means of an auxiliary switching device.

In an embodiment of the present invention, the switching devices are based on MOSFETs.

For example the auxiliary MOSFET is diode-connected in series to current-limiting means.

A suggested implementation of the auxiliary MOSFET in integrated form is also disclosed (with the current-limiting means that is defined by a diode and a JFET being intrinsic to the structure).

A further embodiment of the present invention proposes a power switching system including the switching device and the control circuit.

A suggested implementation of the switching system (including of an IGBT integrated together with the auxiliary MOSFET) is also disclosed.

Another embodiment of the present invention proposes a corresponding method for turning on a power switching device.

BRIEF DESCRIPTION OF THE DRAWINGS

Features and advantages of one or more embodiments of the invention, will be best understood by reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein. Particularly.

DETAILED DESCRIPTION

Figure 1:
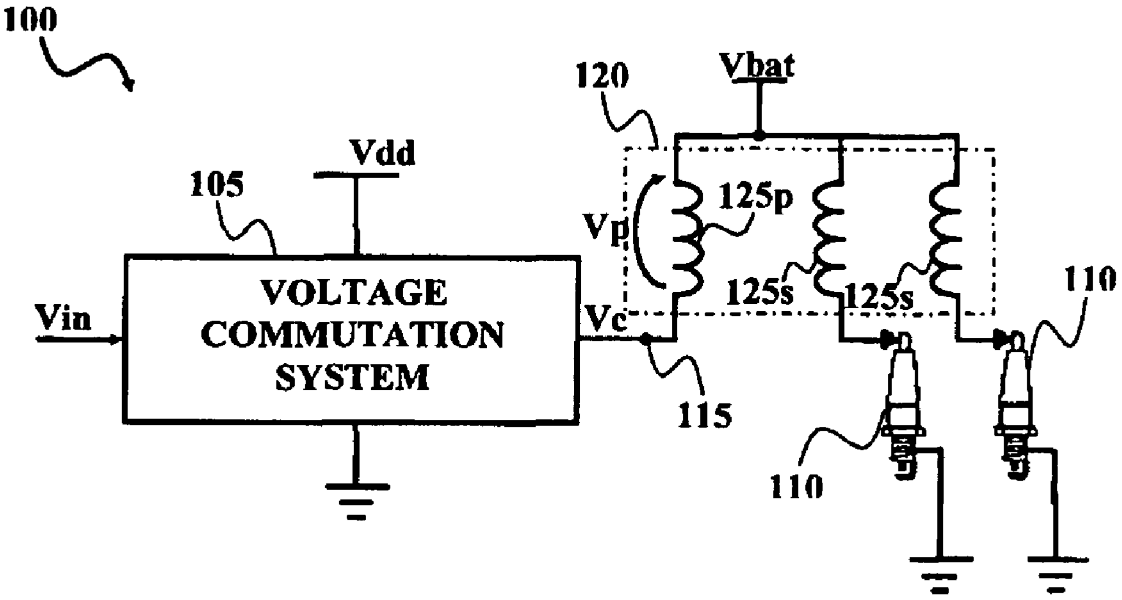
FIG. 1 shows a portion of an automotive electronic circuit comprising a power switching system, in which the solution according to an embodiment of the present invention is applicable.

With reference in particular to FIG. 1, a portion of an electronic circuit 100 for automotive applications is illustrated. The electronic circuit 100 comprises a power switching system 105, which is exploited for controlling the generation of ignition sparks in a plurality of spark plugs 110 (two in the drawing) of an internal-combustion engine.

The switching system 105 is supplied between a ground voltage and a supply voltage Vdd (typically, 5-10V with respect to the ground voltage). The switching system 105 receives a logical signal Vin—which defines a switching command—and supplies a corresponding output signal Vc—which controls the generation of the ignition sparks—to an output terminal 115.

The switching system 105 is coupled with the spark plugs 110 by means of a transformer 120, including a primary winding 125*p* and a plurality of secondary windings 125*s*. The windings 125*p* and 125*s* have first terminals connected together for receiving a battery voltage Vbat (for example, 12V) being provided by an automotive battery (not show in the drawing). A second terminal of the primary winding 125*p* is connected to the output terminal 115 of the switching system 105 for receiving the control signal Vc; accordingly, a transformer voltage Vp across the primary winding is equal to the difference between the battery voltage Vbat and the control signal Vc. A second terminal of each secondary winding 125*s* is coupled with a terminal of the respective spark plug 110, whose other terminal is maintained at the ground voltage.

When the command signal Vin is at a low value (e.g., the ground voltage), the control signal Vc takes a high value roughly equal to the battery voltage Vbat. Accordingly, the transformer voltage Vp (across its primary winding 125*p*) is about equal to 0V and no current flows there through. Some time before the generation of an ignition spark is required (for igniting the internal combustion within the engine), the command signal Vin switches to a high value (e.g., the supply voltage Vdd) and the control signal Vc takes a low value roughly equal to the ground voltage. Accordingly, the transformer voltage Vp increases to a value near the battery voltage Vbat; a charging current having a linear-like pattern then flows through the primary winding 125*p* so as to store energy therein. The command signal Vin then switches back to the low value, thereby causing an abrupt cut of the charging current. Consequently, an extra-voltage appears across the primary winding 125*p*, with a corresponding very high voltage at each secondary winding 125*s* that transfers the energy previously stored in the primary winding 125*p* to the secondary windings 125*s* and then to the spark plugs 110.

Figure 2A:
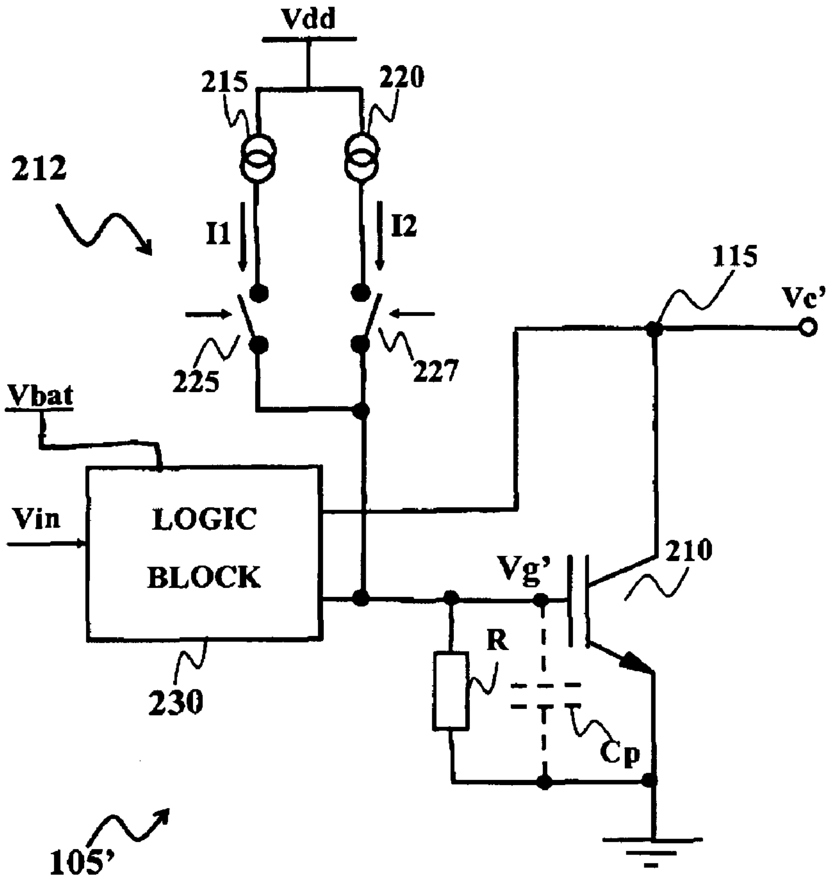
FIG. 2A details the switching system according to a solution known in the art.

Referring now to FIG. 2A, an implementation known in the art of the above-described switching system is denoted with a prime notation (i.e., 105'); the other elements corresponding to those depicted in FIG. 1 are instead denoted with the same references, and their description is omitted for the sake of simplicity.

Particularly, the switching system 105' includes an IGBT 210 acting as a power switching device. As it is known, the IGBT 210 combines a MOS section in input with a bipolar section in output, so as to provide both driving simplicity (of the MOS section) and high current capability (of the bipolar section). The IGBT 210 has a collector terminal receiving the battery voltage Vbat and an emitter terminal receiving the ground voltage; the collector terminal of the IGBT 210 also defines the output terminal 115 of the switching system 105' (providing the desired control signal, denoted in this condition as Vc'). Stray capacitances are associated with a gate terminal of the IGBT 210, which stray capacitances are schematically shown in the drawing by means of an equivalent capacitor Cp (in dashed lines) connected between the gate terminal and the emitter terminal. A pull-down resistor R is also connected between the gate terminal and the emitter terminal (so as to be arranged in parallel with the capacitor Cp).

The IGBT 210 is controlled for its soft turn-on by a circuit denoted as a whole with the reference 212. In detail, the control circuit 212 includes a (direct) current generator 215 supplying a turn-on current I1 (of some hundreds of microamperes), and a (direct) current generator 215 supplying a turn-on current I2 (greater than the current I1 by an order of magnitude). A first terminal of each current generator 215 and 220 receives the supply voltage Vdd, while a second terminal thereof is connected to the gate terminal of the IGBT 210 through a switch 225 and 227, respectively. The control circuit 212 further includes a logic block 230, which receives the command signal Vin; the logic block 212 is also coupled with the output terminal 115 (for receiving the control signal Vc') and with the gate terminal of the IGBT 210 (for receiving its voltage, denoted with Vg'). The logic block 230 opens/closes the switches 225 and 227 by means of respective control signals (not shown in the drawing).

Figure 2B:
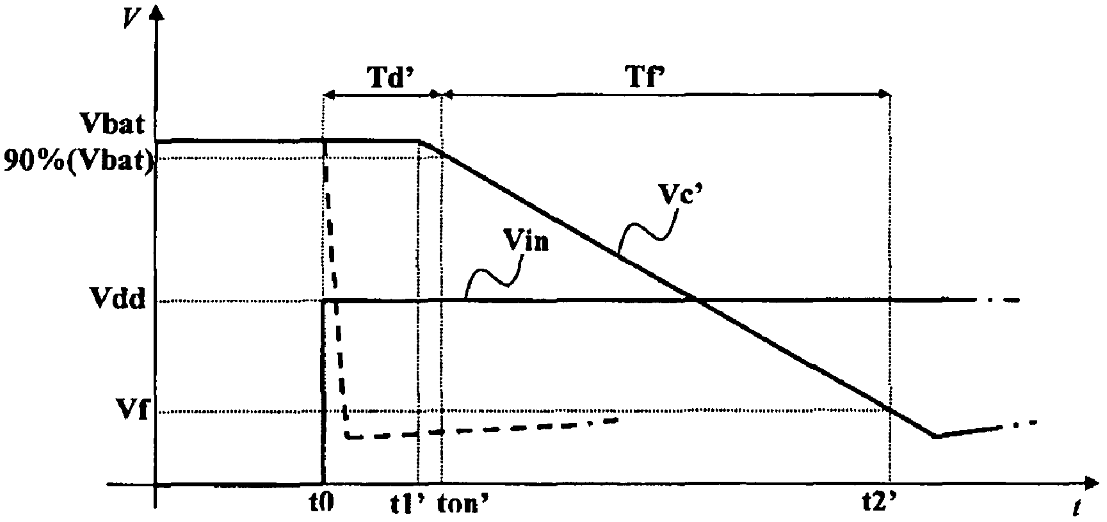
FIG. 2B is a graph of electrical quantities involved in the operation of the switching system of FIG. 2A.

The operation of the switching system 105' will be described in the following with reference to FIG. 2A in conjunction to FIG. 2B (in which the variations over time of some electrical quantities thereof are depicted).

In a rest condition (with the command signal Vin at the low value of the ground voltage), the switches 225,227 are open and the IGBT 210 is off (being its gate voltage Vg'=0V); in this condition, the control signal Vc' is at the battery voltage Vbat (so that the transformer voltage across its primary winding is about 0V).

When the charging of the primary winding is required, at an instant t0 the command signal Vin switches from the low value (the ground voltage) to the high value (the supply voltage Vdd). In response thereto, the logic block 230 closes the switch 225 (connected to the smaller current generator 215), so that the current I1 starts flowing towards the gate terminal of the IGBT 210. Accordingly, the capacitor Cp, forming an RC circuit with the resistor R, starts charging and the gate voltage Vg'—not shown in the graph of FIG. 2B for simplicity of illustration—starts increasing (from the ground voltage).

The IGBT 210 turns on at an instant t1', when the gate voltage Vg'reaches a threshold voltage of the IGBT 210. A time difference between the instant t1' and the instant t0 depends on the threshold voltage of the IGBT 210 and on a rate at which the gate voltage Vg' increases, in turn depending on a plurality of factors (such as the current I1, the resistance of the resistor R, and the capacitance of the capacitor Cp). Particularly, the threshold voltage of the IGBT 210 varies in a relatively large range (for example, from 0.6V to 2V), according to manufacturing process spreads and to temperature variations.

After the instant t1', the control signal Vc' starts falling approximately with a slope depending on the rate at which the gate voltage Vg' increases. When at an instant t2' the control signal Vc' reaches a predefined on-state voltage Vf (for example, 1-2V), the logic block 230 also closes the switch 227 (connected to the bigger current generator 220). Then, the current I2 adds to the current I1 and the IGBT 210 reaches a saturation condition very fast (with the gate voltage Vg' that reaches a steady-state value substantially equal to the supply voltage Vdd); the collector-emitter voltage of the IGBT 210 is then brought to a saturation voltage (such as 0.7-0.8V); in this condition, the control signal Vc' is at the same low voltage (so that the transformer voltage across its primary winding is near the battery voltage Vbat, thereby enabling the charging of the primary winding). During the whole soft turn-on procedure described above, the gate voltage Vg' is also returned to the logic block 230 for other purposes (such as diagnostics).

A turn-on delay Td' of the IGBT 210 is defined as the time between the instant t0, at which the switching of the command signal Vin occurs, and an instant ton', at which the control signal Vc' reaches a value equal to 90% of the battery voltage Vbat. In addition, a fall time Tf' is defined as the time between the instant ton' and the instant t2', at which the control signal Vc'reaches the value of the on-state voltage Vf. The fall time Tf' corresponds to a raise time of the transformer voltage across its primary winding. Then, a relatively long fall time Tf' involves a decrease of the slope of the falling of the control signal Vc' and, then, a lower incremental ratio $\Delta V/\Delta t$ of the transformer voltage across the primary winding (to avoid any undesired ignition sparks). Conversely, if the gate voltage Vg' should be taken sharply to the supply voltage Vdd, then the control signal Vc' (depicted in dashed line in FIG. 2B) might fall very fast; this might bring to a very high incremental ratio $\Delta V/\Delta t$ the transformer voltage across its primary winding (with the above-mentioned overshoot and corresponding risk of undesired ignition sparks). However, the soft turn-on procedure of the IGBT 210 involves a relatively long duration of a corresponding turn-on transient period—between the switching of the command signal Vin and the actual turn-on of the IGBT 210—equal to the sum of the turn-on delay Td' plus the fall time Tf'. Given a predetermined time available, in order to reduce the length of this turn-on transient period without any overshoot (and then the decrease of the energy stored in the primary winding of the transformer), it is possible to act on the turn-on delay Td' only. For this purpose, the gate terminal of the IGBT 210 is pre-charged before applying the current I1. The desired result is achieved by applying a pre-charging voltage—with a value lower than the threshold voltage of the IGBT 210; however, in order to ensure that the IGBT 210 is kept off in any condition (irrespectively of any manufacturing process spreads and temperature variations), the pre-charging voltage typically must be very low, such as 0.1-0.3V, so that the duration of the turn-on delay Td' cannot be reduced significantly.

Figure 3A:
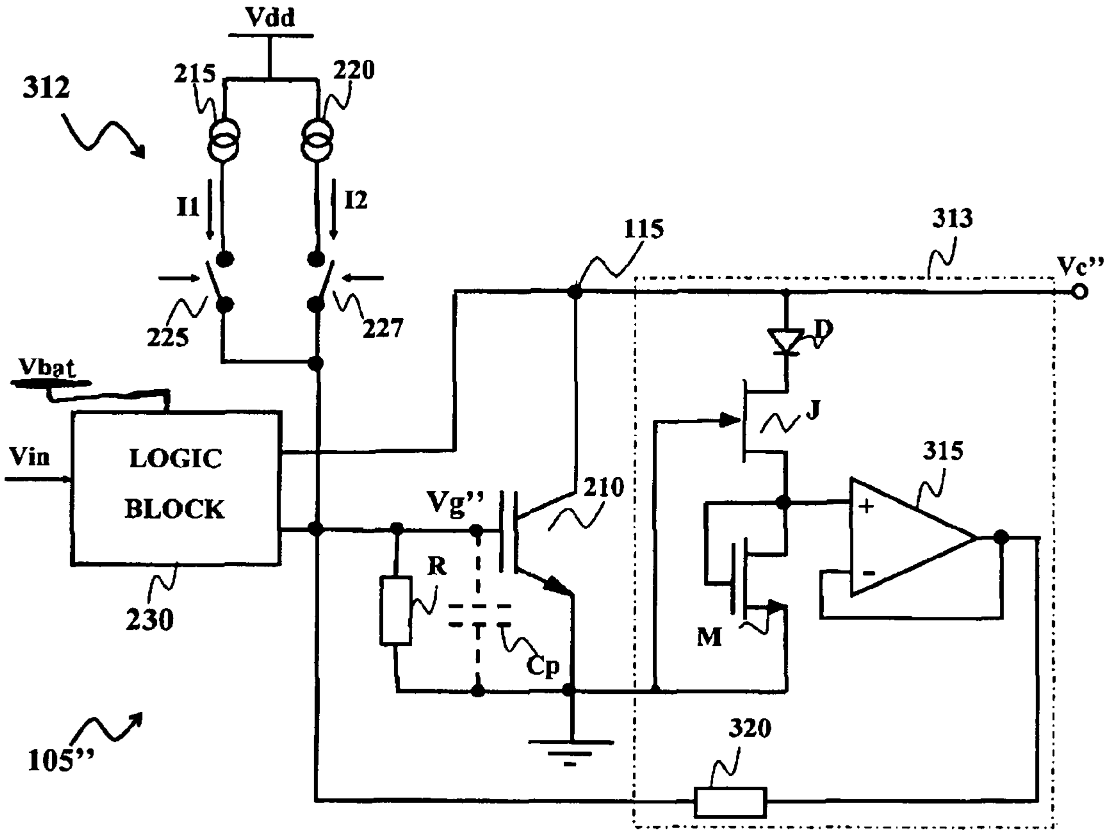
FIG. 3A details the switching system according to an embodiment of the present invention.

Considering now FIG. 3A, an exemplary implementation of the switching system according to an embodiment of the invention is differentiated with a double prime notation (i.e., 105"); the other elements corresponding to those depicted in the preceding figures are instead denoted with the same references, and their description is omitted for the sake of simplicity.

As above, the switching system 105" outputs the control signal for the transformer (not shown in the drawing)—denoted in this condition as Vc". For this purpose, the switching system 105" is provided with a different circuit—denoted as a whole with the reference 312—for controlling the same IGBT 210. Particularly, the control circuit 312 includes, in addition to the above-described structure known in the art, a detector 313. As it will become apparent in the following, the detector 313 senses an indication of the threshold voltage of the IGBT 210, and then sets its pre-charging voltage accordingly.

This allows reducing the length of the turn-on delay of the IGBT 210 for example, as far as possible—without adversely affecting the soft turn-on procedure. Indeed, the detector 313 acts as a threshold voltage follower, so that the pre-charging voltage now self-adapts to the threshold voltage of the IGBT 210. Therefore, the proposed solution may be completely independent of any manufacturing process spreads and temperature variations. As a result, it may be possible to reduce the turn-on delay of the IGBT 210 (and then to ensure a correct generation of the ignition spark) in any situation. Moreover, this may allow controlling the length of the turn-on delay of the IGBT 210 with high accuracy in every operative condition.

More specifically, the core of the detector 313 includes an n-channel MOS transistor M. The MOS M is connected in a diode-configuration, with a drain terminal short-circuited to a gate terminal; the MOS M has a source terminal that receives the ground voltage. In addition, the detector 313 includes an n-channel JFET J. The JFET J has a source terminal connected to the drain and gate terminals of the MOS M, and a gate terminal connected to the source terminal of the MOS M (and then receiving the ground voltage as well). A drain terminal of the JFET J is connected to a cathode terminal of a diode D, which has an anode terminal connected to the output terminal 115.

Furthermore, the detector 313 includes an operational amplifier 315 in buffer configuration. Particularly, the amplifier 315 has a non-inverting input terminal (+) connected to the gate terminal of the MOS M, and an inverting input terminal (−) feedback connected to an output terminal thereof. The output terminal of the amplifier 315 is further coupled with the gate terminal of the IGBT 210 by means of a resistor 320. As a result, a gain of the buffer 315, and 320 so obtained is lower than 1 (according to a resistance of the resistor 320); for example, the gain is set to 0.8-0.99, for example to 0.85-0.95, or to 0.88-0.92 (such as 0.9).

The operation of the switching system 105" according to an embodiment of the invention will be described in the following with reference to FIG. 3A in conjunction to FIG. 3B (in which the variations over time of some electrical quantities thereof are depicted).

As above, in a rest condition (with the command signal Vin at the low value), the switches 225 and 227 are open and the IGBT 210 is off; in this condition, the control signal Vc" is at the battery voltage Vbat (so that the transformer voltage across its primary winding is about 0V). Therefore, the non-inverting input terminal of the buffer 315 is at the threshold voltage of the MOS M (with a current sunk by the diode D and the MOS M that is limited by the JFET J acting as a resistor). The threshold voltage of the MOS M is brought to the output terminal of the buffer 315; therefore, the same value—slightly reduced by the resistor 320—is returned to the gate terminal of the IGBT 210 as its pre-charging voltage. The IGBT 210 and the MOS M are integrated in the same chip of semiconductor material, so that they have threshold voltages substantially equal. Therefore, the gate voltage now denoted with Vg" is brought to a value slightly lower than the threshold voltage of the IGBT 210 so as to ensure that it remains off. It should be noted that this result is achieved by means of an auxiliary component (i.e., the MOS M) so as to avoid any interference with the operation of the IGBT 210.

Figure 3B:
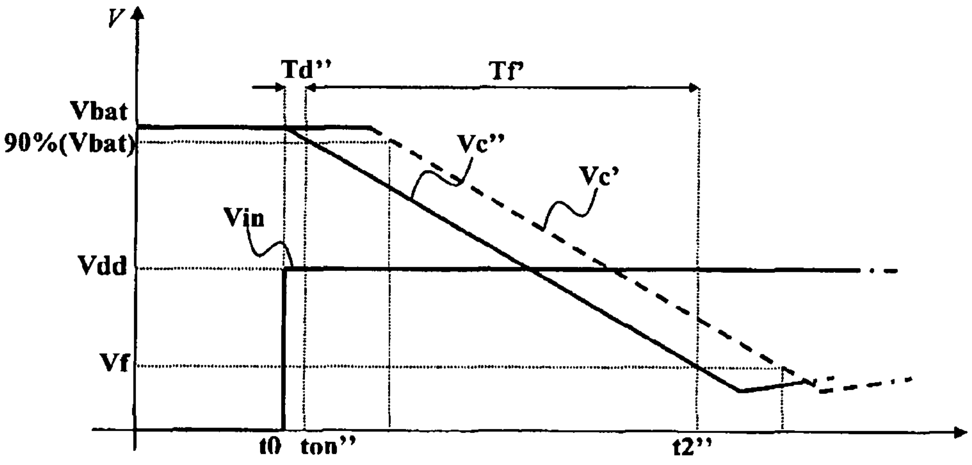
FIG. 3B is a graph of electrical quantities involved in the operation of the switching system of FIG. 3A according to an embodiment of the invention.

Then, when again at the instant t0 the command signal Vin switches from the low value to the high value (with the logic block 230 that closes the switch 225 connected to the smaller current generator 215), the current I1 starts charging the RC circuit formed by the capacitor Cp and the resistor R from a pre-charging voltage that is very close to the threshold voltage of the IGBT 210; therefore, the gate voltage Vg"—not shown in the graph of FIG. 3B for simplicity of illustration—starts increasing from this value and then reaches the threshold voltage of the IGBT 210 substantially immediately.

As a result, the IGBT 210 turns on at substantially the same instant t0. The control signal Vc" then starts falling, with the same slope as above (sketched by the control voltage Vc' in dashed line). Again, when at the instant now denoted with t2" the control signal Vc" reaches the on-state voltage Vf, the logic block 230 also closes the switch 227 (connected to the bigger current generator 220). Then, the current I2 adds to the current I1 and the IGBT 210 reaches the saturation condition very fast.

As can be seen, the instant now denoted with ton" (at which the control signal Vc" reaches the value equal to 90% of the battery voltage Vbat) is now far closer to the instant t0 (at which the switching of the command signal Vin occurs); therefore, the turn-on delay now denoted with Td" may be greatly reduced. At the same time, the fall time Tf' is substantially unaffected, thereby maintaining the desired decrease of the slope of the falling of the control signal Vc", and then the lower incremental ratio $\Delta V/\Delta t$ of the transformer voltage across the primary winding (avoiding any undesired ignition sparks).

Figure 4:
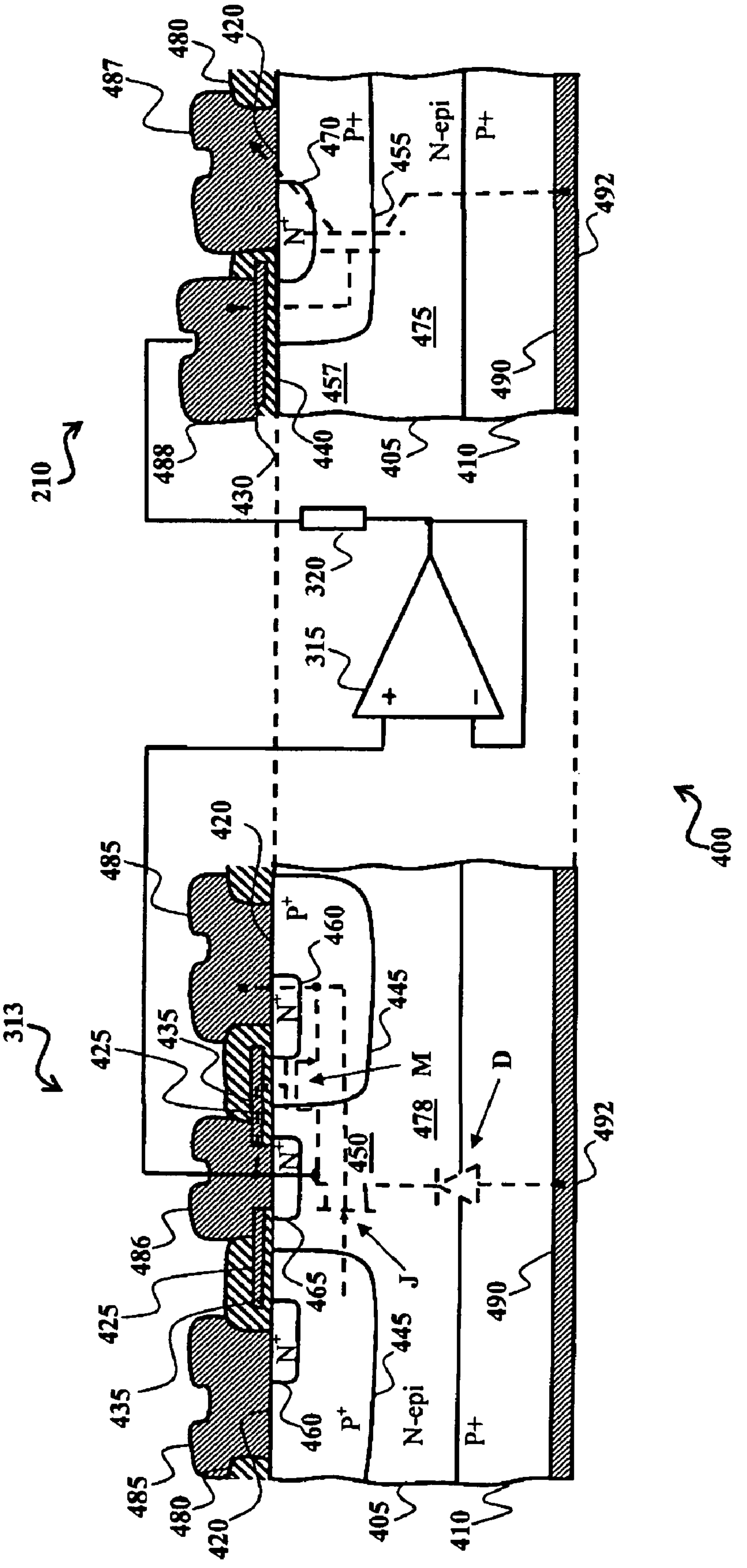
FIG. 4 is a cross-sectional view of a portion of the switching system of FIG. 3A integrated in a chip of semiconductor material according to an embodiment of the invention.

As shown in FIG. 4, the above-described solution may be implemented by integrating the detector 313 and the IGBT 210 in a same chip of semiconductor material 400. Particularly, the figure shows the components 313 and 210 in cross-sectional view, while the buffer 315 is depicted with its circuital symbol for simplicity of illustration; moreover, the IGBT 210 is schematically illustrated in its basic structure (even if it is usually implemented by multiple cells connected in parallel). The type of doping ions (acceptor and donor dopants) in the various regions of the chip 400 are indicated in the following, as usual in the art, by the letters P and N, respectively; the letters P and N have an added minus or plus sign to denote light or heavy doping ions concentrations.

More specifically, the detector 313 and the IGBT 210 are formed in a monocrystalline silicon layer 405, lightly doped by N type dopants (N-epi); the layer 405 is epitaxially grown on a silicon substrate 410, heavily doped by P type dopants (P+).

The chip 400 is covered by a thin dielectric layer of silicon dioxide ($SiO_2$), formed on a front surface 420 thereof; a conductive layer (normally made of polysilicon) is deposed over the dielectric layer, and it is patterned by means of a conventional selective photolithographic process for obtaining a structure—with a circular crown section in any plane parallel to the front surface 420—which forms a gate 425 of the MOS M. The same photolithographic process also patterns a gate 430 of the MOS section of the IGBT 210 (spaced apart from the gate 425).

Different windows are opened in the dielectric layer by means of a further photolithographic process. Particularly, a window having a circular section is self-aligned with an internal edge of the gate 425 and a window having a circular crown section is self-aligned with an external edge thereof; in this way, the dielectric layer underlying the gate 425 takes a circular crown section so as to define a gate oxide 435 of the MOS M. The same photolithographic process also removes the excess dielectric layer being not masked by the gate 430 so as to obtain a gate oxide 440 of the IGBT 210.

An implant followed by a thermal diffusion of acceptor ions (for example, boron) is performed to obtain a heavily P-doped (P+) region through the window surrounding the gate oxide 435 (extending into the epitaxial layer 405 from the front surface 420). This region (having a circular crown section as well) defines a body region 445 of the MOS M, which partially underlies a corresponding edge of the gate oxide 435. The same body region 445 surrounds a cylindrical portion of the epitaxial layer 405 (underlying the window inside the gate oxide 435), which defines a drain region 450 of the MOS M. A further implant followed by a thermal diffusion of boron ions is performed to obtain a P+ region through the window adjacent the gate oxide 430 (extending into the epitaxial layer 405 from the front surface 420). This region defines a body region 455 of the MOS section of the IGBT 210, which partially underlies a corresponding border of the gate oxide 430. In this way, a portion of the epitaxial layer 405 adjacent the body region 455 defines a drain region 457 of the MOS section of the IGBT 210.

Heavily N-doped regions are formed extending from the front surface 420 by an implant of donor ions (for example, of phosphorus). Particularly, an N+ region within the body region 445 of the MOS M (self-aligned with the outer edge of its gate 425) defines a source region 460 thereof; the source region 460 has a similar circular crown section that surrounds the gate 435. In this way, a channel of the MOS M is defined in the body region 445 (between the source region 460 and the drain region 450). Moreover, an N+ region within the drain region 450 of the MOS M (self-aligned with the inner edge of its gate 425) defines a drain contact region 465 thereof. Likewise, an N+ region within the body region 455 of the MOS section of the IGBT 210 (self-aligned with an outer edge of its gate 430) defines a source region 470 thereof. In this way, a channel of the MOS section of the IGBT 210 is defined in the body region 455 (between the source region 470 and the drain region 457).

At the same time, a bipolar section of the IGBT 210 is formed by the P+ region 455 (emitter region), a buried region 475 of the epitaxial layer 405 (base region coupled with the drain region 457 of its MOS section), and the P+ substrate 410 (collector region).

Moreover, the above-described structure of the MOS M intrinsically defines the JFET J and the diode D. Particularly, the JFET J is formed by the region 450 of the epitaxial layer 405 (body region), the N+ region 465 (source region in common with the drain region of the MOS M), a buried region 478 of the epitaxial layer 405 (drain region), and the P+ region 445 (gate region). In addition, the diode D is formed by the P+ substrate 410 (anode region in common with the collector region of the bipolar section of the IGBT 210) and the buried region 478 of the epitaxial layer 405 (cathode region in common with the drain region of the JFET J).

The structure so obtained on the front surface 420 is now covered with a protective dielectric layer 480. Contact windows are opened in the dielectric layer 480 for corresponding metal plugs. Particularly, a metal plug 485 contacts the source region 460 and the body region 445 of the MOS M, as so to provide its source terminal; a further a metal plug 486 contacts the drain contact region 465 and the gate 425 of the MOS M, as so to provide its drain and gate terminals short-circuited to each other. In this way, the gate region 445 of the JFET J is automatically connected to the source region 460 of the MOS M (through the metal plug 485). Likewise, a metal plug 487 contacts the emitter region 470 of the bipolar section and the source region 470 of the MOS section of the IGBT 210, as so to provide its emitter terminal; a further metal plug 488 contacts the gate 430 of the MOS section of the IGBT 210, as so to provide its gate terminal. A back surface 490 of the chip 400 is covered with a metal layer, which is patterned for obtaining a metal plug 492 contacting the collector region (i.e., the substrate 410) of the bipolar section of the IGBT 210, as so to provide its collector terminal.

It should be apparent that the detector 313 can be easily integrated in the same chip of the IGBT 210 by exploiting the same manufacturing process (with the addition of a few further steps). More specifically, the proposed structure of the MOS M with circular crown section allows obtaining the additional components J and D with the required connections automatically. Moreover, the diode D is of the substrate type, so that it is well suited to support high voltages (up to the value of the battery voltage Vbat, i.e., 12V). In addition, the arrangement of the JFET J ensures that any increase of the voltage applied to the components D, J, and M causes an increase of the voltage at its gate region 460; this brings about a reduction of the channel of the JFET J (in the body region 450), which in turn increases its resistance (thereby limiting the corresponding current being sunk automatically).

Naturally, in order to satisfy local and specific requirements, a person skilled in the art may apply to the solution described above many modifications and alterations. More specifically, although one or more embodiments of the present invention have been described with a certain degree of particularity, it should be understood that various omissions, substitutions and changes in the form and details as well as other embodiments are possible. Particularly, the proposed embodiment(s) may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

Particularly, similar considerations apply if the switching system (and especially its control circuit) has a different structure or includes equivalent components.

Alternatively, equivalent means may be used for sensing an indication of the threshold voltage of the IGBT; for example, it is possible to avoid reducing the sensed value (when it is derived from a component having a threshold voltage intrinsically lower than the one of the IGBT).

Similar considerations apply if the gain of the buffer is reduced with other techniques; in any case, the buffer may be replaced with any equivalent structure.

Moreover, nothing prevents measuring the threshold voltage directly on the IGBT (without the need of any auxiliary component).

The concepts described herein are also applicable to power switching devices of other type (for example, consisting of MOSFETs or BJTs).

Similar considerations apply if the detector is implemented with a different structure (for example, with the MOS being not in the diode-configuration).

The disclosed ideas may also be applied to other layouts of the corresponding integrated structure (even with the addition of dedicated components).

Although in the preceding description reference has been made to the generation of ignition sparks, this is not to be interpreted in a limitative manner; indeed, the proposed solution lends itself to be exploited in different applications, even outside the automotive field (such as for controlling an electric motor).

Similar considerations apply if the IGBT has a different structure; in any case, the possibility of integrating the detector and the IGBT in two distinct chips is not excluded.

It is emphasized that the described manufacturing process is not to be interpreted in a limitative manner. Particularly, it is possible to use equivalent steps, to remove some steps being not essential, or to add further optional steps—even in a different order; moreover, the masks used during the process may be different in number and in type. Similar considerations apply if the regions of the N-type are replaced by regions of the P-type, and vice-versa, if the integrated structure is manufactured using a different technology, and the like.

It should be readily apparent that the proposed structure might be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages. Moreover, the proposed solution may be integrated with other circuits in the same chip, or it may be mounted in intermediate products (such as mother boards). In any case, the integrated circuit is suitable to be used in complex systems (such as logic controllers or automobiles).

The invention claimed is:

1. A control circuit for turning on a power switching device, the switching device turning on in response to a control signal exceeding a threshold value, wherein the control circuit includes:

pre-charging means for providing the control signal at a pre-charging value not reaching the threshold value, and soft turn-on means for gradually increasing the control signal from the pre-charging value to a turn-on value exceeding the threshold value, wherein the pre-charging means includes:

means for sensing an indication of the threshold value, and means for setting the pre-charging value according to the sensed threshold value.

2. The control circuit according to claim 1, wherein the means for setting is adapted to set the pre-charging value to the sensed threshold value reduced by a predetermined amount.

3. The control circuit according to claim 2, wherein the means for setting includes a buffer for receiving the sensed threshold value and for providing the pre-charging value, the buffer having a gain lower than 1.

4. The control circuit according to claim 1, wherein the means for sensing includes:

an auxiliary switching device having a further threshold value corresponding to the threshold value, and means for measuring the further threshold value, the indication of the threshold value consisting of the measured further threshold value.

5. The control circuit according to claim 4, wherein the switching device includes an input stage based on a MOSFET, the threshold value including a threshold voltage of the MOSFET, and wherein the auxiliary switching device includes a further MOSFET, the further threshold value consisting of a further threshold voltage of the further MOSFET.

6. The control circuit according to claim 5, wherein the means for sensing includes a circuital branch having a first terminal and a second terminal for connection to the switching device, the branch including the auxiliary MOSFET and current-limiting means connected in series between the first terminal and the second terminal, wherein the auxiliary MOSFET is in a diode-configuration with a source terminal and a common drain/gate terminal connected to the means for measuring.

7. The control circuit according to claim 6, wherein the means for sensing is integrated in a chip of semiconductor material having a substrate of a first type of conductivity and an active layer of a second type of conductivity stacked between a back surface (490) and a front surface of the chip, the auxiliary MOSFET including:

a body region of the first type of conductivity extending into the active layer from the front surface, the body region having an annular section in any plane parallel to the front surface, a drain region included in a portion of the active layer being surrounded by the body region, a source region of the second type of conductivity extending into the body region from the front surface, a channel being formed in the body region between the source region and the drain region, a gate extending over the channel, the gate being insulated from the chip, the source terminal contacting the source region, and the drain/gate terminal contacting the drain region and the gate, wherein the current-limiting means includes an intrinsic diode, being formed by a cathode region included in the substrate and an anode region included in a portion of the active layer being buried in the chip under the drain region, and an intrinsic JFET, being formed by a further source region in common with the drain region, a further drain region in common with the anode region, and a gate region in common with the body region.

8. A power switching system including:

a power switching device, the switching device turning on in response to a control signal exceeding a threshold value, and the control circuit according to claim 7 for turning on the switching device.

9. The switching system according to claim 8, wherein the switching device is integrated in said chip, the switching device including:

a further body region of the first type of conductivity extending into the active layer from the front surface, a still further drain region included in a portion of the active layer adjacent the body region, a still further source region of the second type of conductivity extending into the further body region from the front surface, a further channel being formed in the further body region between the still further source region and the still further drain region, a further gate extending over the further channel, the further gate being insulated from the chip, an emitter region in common with the further body region, a base region included in a portion of the active layer being buried in the chip under the emitter region, a collector region included in the substrate, an emitter terminal contacting the emitter region and the still further source region, a further gate terminal contacting the further gate, and a collector terminal contacting the collector region.

10. A method for turning on a power switching device, the switching device turning on in response to a control signal exceeding a threshold value, wherein the method includes the steps of:

pre-charging the switching device by providing the control signal at a pre-charging value not reaching the threshold voltage, and soft turning-on the switching device by gradually increasing the control signal from the pre-charging value to a turn-on value exceeding the threshold value, wherein the step of pre-charging includes:

sensing an indication of the threshold value, and setting the pre-charging value according to the sensed threshold value.

11. A bias generator for biasing a device, the bias generator comprising:

a first circuit operable to determine a turn-on threshold of the device; and a second circuit operable to provide to the device a bias signal having a magnitude that is related to the turn-on threshold.

12. The bias generator of claim 11 wherein:

the first circuit comprises a component having substantially the turn-on threshold; and the second circuit is operable to generate the bias signal from the turn-on threshold of the component such that the magnitude of the bias signal is smaller than the turn-on threshold.

13. A bias generator for biasing a device, the bias generator comprising:

a first circuit operable to determine a turn-on threshold of the device; and a second circuit operable to provide to the device a bias signal having a magnitude that is related to the turn-on threshold, wherein:

the first circuit comprises a MOS transistor having substantially the turn-on threshold; and the second circuit comprises an amplifier operable to receive from the first circuit a signal that represents the turn-on threshold of the MOS transistor and to generate the bias signal by amplifying the first circuit signal with a gain that is less than unity.

14. The bias generator of claim 11, further comprising:
first and second supply nodes;
wherein the first circuit comprises a MOS transistor having a gate and a first source/drain coupled to the first supply node and having a second source/drain coupled to the second supply node; and
the second circuit comprises
an amplifier having a non-inverting input node coupled to the gate of the MOS transistor, an inverting input node, and an output node coupled to the inverting input node, and
an impedance having a first node coupled to the output node and having a second node operable to provide the bias voltage.

15. The bias generator of claim 11, further comprising:
first and second supply nodes;
wherein the first circuit comprises
a diode coupled to the first supply node,
a first transistor having a gate coupled to the second supply node, a first source/drain coupled to the diode, and a second source/drain, and
a MOS transistor having a gate and a first source/drain coupled to the second source/drain of the first transistor, and having a second source/drain coupled to the second supply node; and
the second circuit comprises
an amplifier having a non-inverting input node coupled to the gate of the MOS transistor, an inverting input node, and an output node coupled to the inverting input node, and
a resistance having a first node coupled to the output node and having a second node operable to provide the bias voltage.

16. A drive circuit, comprising:
a drive device having a control node and a first activation threshold;
a first circuit operable determine the first activation threshold; and
a second circuit operable
to receive an indication of the first activation threshold from the first circuit, and
to provide to the control node of the drive device a bias signal having a magnitude that is related to the first activation threshold.

17. The drive circuit of claim 16 wherein the drive device comprises a transistor.

18. The drive circuit of claim 16 wherein:
the first circuit comprises a MOS transistor having a second activation threshold substantially equal to the first activation threshold and is operable to generate as the indication of the first activation threshold a signal equal to the second activation threshold; and
the drive device and the MOS transistor are disposed on a same integrated-circuit die.

19. The drive circuit of claim 16, further comprising:
first and second supply nodes;
wherein the first circuit comprises a MOS transistor having a gate and a first source/drain coupled to the first supply node and having a second source/drain coupled to the second supply node; and
the second circuit comprises
an amplifier having a non-inverting input node coupled to the gate of the MOS transistor, an inverting input node, and an output node coupled to the inverting input node, and
an impedance having a first node coupled to the output node and having a second node coupled to the control node of the drive device.

20. The drive circuit of claim 16, further comprising:
first and second supply nodes;
wherein the first circuit comprises
a diode coupled to the first supply node,
a field-effect transistor having a gate coupled to the second supply node, a first source/drain coupled to the diode, and a second source/drain, and
a MOS transistor having a gate and a first source/drain coupled to the first supply node and having a second source/drain coupled to the second supply node; and
wherein the second circuit comprises
an amplifier having a non-inverting input node coupled to the gate of the MOS transistor, an inverting input node, and an output node coupled to the inverting input node, and
an impedance having a first node coupled to the output node and having a second node coupled to the control node of the drive device.

21. The drive circuit of claim 16, further comprising:
wherein the drive device comprises a drive node; and
an impedance coupled between the control and drive nodes of the drive device.

22. A drive circuit, comprising:
a drive device having a control node and a first activation threshold;
a first circuit operable determine the first activation threshold; and
a second circuit operable to receive an indication of the first activation threshold from the first circuit, and
to provide to the control node of the drive device a bias signal having a magnitude that is related to the first activation threshold, further comprising:
first and second current sources; and
a logic circuit operable
to receive an activation signal,
to couple the first current source to the control node of the first device for a first time in response to receiving the activation signal, and
to couple the second current source to the control node of the first device after the first time expires.

23. A system, comprising:
a first integrated circuit comprising
a drive device having a control node and a first activation threshold,
a first circuit operable determine the first activation threshold, and
a second circuit operable
to receive an indication of the first activation threshold from the first circuit, and
to provide to the control node of the drive device a bias signal having a magnitude that is related to the first activation threshold; and
a second integrated circuit coupled to the first integrated circuit.

24. The system of claim 23 where the second integrated circuit comprises a controller.

25. The system of claim 23 wherein the first and second integrated circuits are disposed on respective dies.

26. The system of claim 23 wherein the first and second integrated circuits are disposed on a same die.

27. The system of claim 23, further comprising:
wherein the drive device comprises a drive node; and
an inductive load coupled to the drive node.

28. The system of claim 23, further comprising:

wherein the drive device comprises a drive node; and an ignition coil coupled to the drive node.

29. A method, comprising:

generating a bias signal that tracks a turn-on threshold of a device;

biasing the device with the bias signal.

30. The method of claim 29 wherein generating a bias signal comprises generating a voltage that tracks a turn-on voltage of the device.

31. The method of claim 29 wherein generating a bias signal comprises generating the bias signal having a magnitude that is less than a magnitude of the turn-on threshold.

32. The method of claim 29 wherein generating a bias signal comprises generating the bias signal from a gate-to-source voltage of a diode-coupled transistor having substantially a same turn-on threshold as the device and disposed on a same die as the device.

33. The method of claim 29, further comprising:

generating an intermediate signal having a magnitude that is substantially equal to the turn-on threshold of the device; and amplifying the intermediate signal with a gain less than unity to generate the bias signal.

34. The method of claim 29, further comprising turning on the biased device such that a voltage across the device decreases substantially linearly.

35. A method comprising:

generating a bias signal that tracks a turn-on threshold of a device;

biasing the device with the bias signal, further comprising:

wherein generating the bias signal comprises generating a bias voltage;

wherein biasing the device comprises charging an input capacitance of the device to the bias voltage;

turning on the biased device by further charging the input capacitance with a substantially constant current.

36. The method of claim 29, further comprising:

wherein generating the bias signal comprises generating a bias voltage;

wherein biasing the device comprises charging an input capacitance of the device to the bias voltage;

turning on the biased device by further charging the input capacitance with a first substantially constant current; and further charging the input capacitance with a second substantially constant current when a voltage across the device is at a level.

* * * * *

UNITED STATES PATENT AND TRADEMARK OFFICE

CERTIFICATE OF CORRECTION

PATENT NO. : 7,924,081 B2
APPLICATION NO. : 12/012213
DATED : April 12, 2011
INVENTOR(S) : Costanzo Lorenzo et al.

It is certified that error appears in the above-identified patent and that said Letters Patent is hereby corrected as shown below:

- In Claim 13, Column 12, Line 60, “threshold, wherein:” should read --threshold, wherein--.

- In Claim 16, Column 13, Line 39, “a first circuit operable determine the first activation threshold” should read --a first circuit operable to determine the first activation threshold--.

- In Claim 22, Column 14, Line 30, “a first circuit operable determine the first activation threshold” should read --a first circuit operable to determine the first activation threshold--.

- In Claim 23, Column 14, Line 49, “a first circuit operable determine the first activation” should read --a first circuit operable to determine the first activation--.

Signed and Sealed this
Sixth Day of September, 2011

David J. Kappos
*Director of the United States Patent and Trademark Office*

UNITED STATES PATENT AND TRADEMARK OFFICE

CERTIFICATE OF CORRECTION

PATENT NO. : 7,924,081 B2
APPLICATION NO. : 12/012213
DATED : April 12, 2011
INVENTOR(S) : Lorenzo Costanzo et al.

It is certified that error appears in the above-identified patent and that said Letters Patent is hereby corrected as shown below:

Item 75 - In the face of the patent first inventor's name "Costanzo Lorenzo" should be -- Lorenzo Costanzo --.

Item 75 - In the face of the patent second inventor's name "Patti Davide Giuseppe" should be -- Davide Giuseppe Patti --.

Item 75 - In the face of the patent third inventor's name "Tagliavia Donato" should be -- Donato Tagliavia --.

Signed and Sealed this
Twentieth Day of November, 2012

David J. Kappos
*Director of the United States Patent and Trademark Office*